United States Patent [19]

Fish

[11] Patent Number: 4,594,542
[45] Date of Patent: Jun. 10, 1986

[54] SOLID STATE, HIGH-LOW RESISTANCE MONITOR

[75] Inventor: Franklin H. Fish, Indianapolis, Ind.

[73] Assignee: The United States of America as represented by the Secretary of the Navy, Washington, D.C.

[21] Appl. No.: 581,835

[22] Filed: Feb. 21, 1984

[51] Int. Cl.[4] ............................................. G01R 27/02
[52] U.S. Cl. ........................................ 324/62; 340/660
[58] Field of Search ..................... 324/62 R, 65 R, 98, 324/101, 64, 96, DIG. 1; 340/660, 661, 662, 663, 664; 250/210

[56] References Cited

U.S. PATENT DOCUMENTS

| | | | |
|---|---|---|---|
| 3,086,170 | 4/1963 | Kemelhor et al. | 324/65 R |
| 3,479,589 | 2/1967 | Owens | 324/62 |
| 3,530,378 | 9/1970 | Holle et al. | 340/661 X |
| 3,628,099 | 12/1971 | Atkins et al. | 317/134 |
| 3,875,501 | 4/1975 | Hayashi | 324/62 |
| 4,031,461 | 6/1977 | Reiner | 324/51 |
| 4,052,664 | 10/1977 | Pohl | 423/51 |
| 4,110,571 | 8/1978 | Hills | 179/175.1 A |
| 4,298,969 | 11/1981 | Rickenbacker | 367/76 |

OTHER PUBLICATIONS

Callahan, Current/Voltage Variation Detector, IBM Technical Disclosure Bulletin, vol. 21, No. 10, Mar. 1979, pp. 3992–3993.

*Primary Examiner*—Gerard R. Strecker
*Assistant Examiner*—Jack B. Harvey
*Attorney, Agent, or Firm*—Robert F. Beers; Harvey A. David

[57] ABSTRACT

A resistance monitoring solid state circuit distinguishes between a minimum high resistance condition and a maximum low resistance condition by current mode switching of a pair of transistors the switching control voltages of which are established by bias resistor networks forming legs of a bridge, with the monitored resistance in one leg, the transistors switching current flow into one or the other of two logic signal generating paths that include opto-isolators for electrical isolation from utilization circuitry.

6 Claims, 2 Drawing Figures

| SWITCHING POINT CONTROL VOLTAGES VS. R (MONITORED) | | |
|---|---|---|
| R (MONITORED) | Q3 BASE VOLTAGE | Q3 BASE TO Q2 BASE CONTROL VOLTAGE |
| 0 Ω | 17.94V | −3.42V |
| 150 Ω | 18.80V | −2.56V |
| 1K Ω | 21.34V | ≈ 0V |
| 2K Ω | 22.51V | + 1.15V |
| ∞ | 24.90V | + 3.54V |

SOLID STATE, HIGH-LOW RESISTANCE MONITOR

BACKGROUND OF THE INVENTION

This invention relates to the field of electrical circuit condition monitoring, and more particularly to a monitoring means for determining the existence of high and low resistance conditions in a circuit external to the monitoring means.

In certain military airborne electronic, or avionics, systems predetermined high and low resistance conditions are indicative of operating modes, states of readiness, or the like, which are required to be known. In the past, such avionics systems having this requirement have utilized a monitor circuit which has as its principal element a +28 VDC, electromechanical relay and relies on the difference between pick-up current and the drop-out current of the relay to control alternative energization of utilization means such as system control logic or first and second indicator lamps to indicate existence of predetermined high or low resistance conditions ($R_H$ and $R_L$) in the circuit being monitored. In the actual avionics application the interface conditions are specified and the monitor circuit is designed to meet these requirements. A range of resistance values is specified for both $R_L$ and $R_H$. Additional specifications include: a minimum and maximum value for $I_L$ the permissible current flow through $R_L$, maximum and minimum values of open circuit voltage, and minimum isolation resistance between the monitor circuitry and other interface functions. In addition, the monitor circuit must meet the applicable environmental requirements including extended temperature range operation, high humidity, and extremes of vibration and shock. High reliability and fail-safe operation are also required of the monitor circuit.

Electro-mechanical relay parameters exhibit wide tolerances, and vary considerably with such environmental factors as temperature and vibration. Both pick-up and drop-out current vary over a wide range. The relay coil, itself, is wound from copper magnet wire. The resistive component of coil impedance, therefore, exhibits a large positive temperature coefficient. The coil resistance increases by 40 percent at +125° C. as referred to the +25° C. value. The inductive portion of the coil impedance is highly non-linear. The exact value of inductance depends on the degree of relay closure since the width of the magnetic air-gap varies correspondingly.

It has further been determined that for the relay type of monitor circuit to be implementable the ratio of the maximum pick-up current to the minimum drop-out current must be less than the ratio of $R_H$ (minimum) to $R_L$ (maximum). Recent advances in certain avionics systems have resulted in a requirement for monitoring resistance conditions where the ratio of $R_H$ to $R_L$ is considerably lower than the ratio of pick-up to drop-out currents, and the known relay type of monitoring circuit cannot be implemented.

An additional requirement of newer avionics systems is the need for the resistance monitoring circuit to be operable at low frequency AC. Under conditions of continuous AC operation electro-mechanical relay lifetime limitations present reliability and/or maintenance problems.

SUMMARY OF THE INVENTION

With the foregoing in mind, it is a principal object of this invention to provide a solid state high-low resistance monitoring circuit that is free of the previously discussed limitations of electro-mechanical relay based monitor circuits.

Another important object is the provision of a resistance monitoring circuit for use in sensing and indicating the existence of predetermined high and low resistance conditions in an electronic system being monitored, and which monitoring circuit is flexible in design so as to be able to accommodate predetermined resistance conditions selected from a wide range of values and ratios.

Another object is to provide a high-low resistance monitoring circuit that is relatively unaffected by changes in operating temperature, humidity, and shock or vibration.

As yet another object the invention aims to provide a solid state resistance monitor of the foregoing characteristics and which is operable with low frequency AC conditions.

A further object is to provide a resistance monitoring circuit that has a wider and more tightly controlled usable resistance monitoring range than has been achievable with electro-mechanical relay type circuits, and that has a negligible hysteresis effect.

Still another object is to provide a resistance monitoring circuit gaining the reliability of solid state circuitry, and which has redundant logic output signal paths for improved fail-safe operation.

Other objects and many of the attendant advantages will be readily appreciated as the subject invention becomes better understood by reference to the following detailed description, when considered in conjunction with the accompanying drawings.

DESCRIPTION OF THE PREFERRED EMBODIMENT

Figures 1, 2:
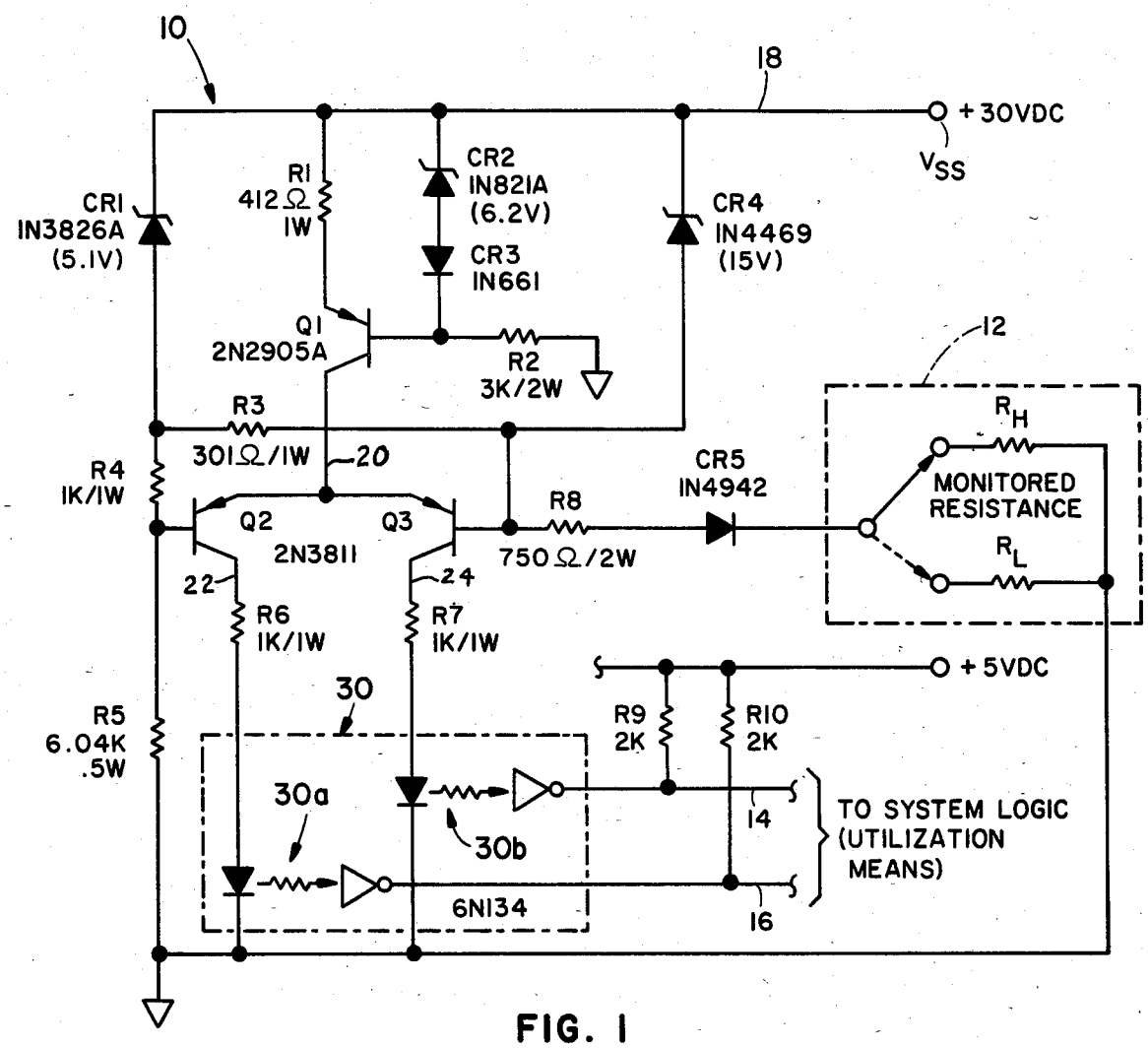
FIG. 1 is a diagrammatic illustration of a solid state, high-low resistance monitoring circuit embodying the invention.
FIG. 2 is a table providing exemplary monitor circuit voltages corresponding to sensed external resistance values.

Referring now to FIG. 1, an exemplary resistance monitoring circuit according to the invention is indicated generally at 10 and is shown in association with a monitored resistance R forming part of an external circuit 12.

Briefly, the circuit 10 is provided with two output lines or conductors 14 and 16 each having first and second logic conditions or voltages which provide a logical representation of the condition or state of resistance R. Thus, when the resistance value of R is above a predetermined high value $R_H$, line 14 exhibits a first logic condition if below that value, a second logic condition. When the resistance value of R is below a predetermined low value $R_L$, line 16 exhibits a first logic condition, and if above that value, a second logic condition. In the example of FIG. 1, the component values shown are for a specific monitor application wherein $R_H$ is a minimum of 2KΩ and $R_L$ is a maximum of 150Ω. The configuration of monitor circuit 10 possesses considerable design flexibility and, therefore, can be easily modified to meet other design specifications as will be made apparent in the following description and analysis.

The solid state monitor circuit 10 comprises differential, current-mode switch means utilized in a bridge configuration with the external resistance R to be monitored as part of one leg of the bridge and PNP transistors Q2 and Q3 as the current switches. The circuit 10 is connected via line 18 to a +30 VDC voltage source $V_{SS}$, and transistor Q1, resistors R1 and R2, and diodes CR2 and CR3 serve as the switched current source connected via line 20 to transistors Q2 and Q3. The differential outputs of the current-mode switch means, lines 22, 24, are applied via resistors R6 and R7 to drive an opto-isolator integrated circuit 30, which provides electrical isolation between the external resistance R and the rest of the avionics system.

Because of the relatively high supply voltage it is possible to utilize a conventional PNP transistor current source configuration. Diodes CR2 and CR3, and resistor R2 comprise the base voltage bias network. Diode CR2 is a 6.2 V temperature compensated zener voltage reference. Resistor R2 controls the bias current level for diode CR2. The resistance value of R2 is chosen so that a bias current level of 7.5 ma is established through reference diode CR2. This is the specified bias current level for optimum temperature stabilization of the reference voltage. The purpose of diode CR3 is to compensate for the variation in base-emitter voltage of transistor Q1 with temperature. If it is assumed that the base-emitter voltage of transistor Q1 equals the forward voltage drop across diode CR3 and that Q1 base current is equal to zero, then $$I \text{ (current source)} = \frac{V_z(CR2)}{R1} = \frac{6.2V}{412\Omega} = 15.05 \text{ ma.}$$

A current source output level of 15 ma is chosen since this is the optimum bias level for the light emitting diodes (LED's) contained in a pair of integrated circuit opto-isolators 30a and 30b. The advantages of this type of current source configuration include excellent stability of output current with temperature variation, and high output impedance.

As mentioned earlier, transistors Q2 and Q3 are the current-mode switching devices. The switch is controlled by the differential voltage between the two base inputs. Under steady state conditions one transistor is completely turned "off" and the other transistor is in the linear region of operation. The transistor operating in the linear region conducts the entire 15 ma output of the current source. Neither of the transistors saturates under any condition of operation.

The current-mode switch possesses relatively high AC gain so the transition region is narrow and well controlled. A base-to-base differential voltage on the order of 100 millivolts is sufficient to completely switch the circuit 10. Diode CR1, and resistors R4 and R5 provide the DC bias voltage for transistor Q2. The nominal design value in this example is 21.36 volts at the base of transistor Q2. If the base voltage of transistor Q3 is 100 millivolts greater than this value, then Q3 will be "off" and transistor Q2 will conduct the current source output current. Conversely, if the base voltage of transistor Q3 is 100 millivolts less than the base bias voltage of transistor Q2, then Q2 will be in the "off" state and Q3 will conduct the 15 ma current source output. The voltage at the base of transistor Q3 is determined by the bias network comprised of diodes CR1 and CR5, and resistors R3, R8, and the monitored external resistance R. The resistance value of R, therefore, controls the voltage level applied to the base of transistor Q3. The resistor values given in FIG. 1 are optimized for $R_H = 2K\Omega$ (min) and $R_L = 150\Omega$ (max). The table of FIG. 2 lists various values of R (external) and the corresponding base voltages. It is apparent from the table that transistor Q3 is "off" for $R_L = 150\Omega$ and fully conducting for $R_H = 2K\Omega$, in each case with a considerable margin of safety.

Referring again to FIG. 1 it is seen that Zener diode CR1 is common to both base bias networks. The derivation of both base bias voltages from a common reference provides a number of advantages. First, this configuration results in the base-to-base differential bias voltage being relatively insensitive to changes in the $V_{ss}$ supply votage, to variations in CR 1 zener voltage, and to resistor mis-match and temperature tracking errors. An additional advantage is that under the operating condition where R (external) has a very high resistance value, the monitor circuit internal bias method utilized ensures proper switching action and high immunity to external noise sources. Under this open circuit condition the base-to-base differential voltage is equal to the voltage drop across resistor R4. The nominal value of this voltage is 3.5 volts. The base of transistor Q3 is, therefore, returned to a voltage 3.5 volts greater than the bias voltage at the base of transistor Q2 via the relatively low resistance path provided by resistor R3.

This analysis assumes a substantially perfect match of transistors Q2 and Q3 base-emitter voltages both initially and over the operating temperature range. Any mis-match in base emitter voltages will shift the switching point voltage a corresponding amount. For this reason a matched transistor pair enclosed in a common device package is preferably selected for transistors Q2 and Q3. The type 2N3811A transistor has an initial $V_{BE}$ maximum differential mismatch of 1.5 mV at +25° C. with an additional maximum error of ±0.5 mV over the −55° C. to +125° C. temperature range. This 2 mV maximum differential error is insignificant when compared with the differential base-to-base voltage magnitudes listed in FIG. 2. Resistors R6 and R7 are added to reduce the power dissipation in transistors Q2 and Q3, respectively. Lower power dissipation in transistor Q2 and Q3 results in better thermal matching of device parameters and more reliable operation. The values of resistors R6 and R7 must be chosen so that neither transistor saturates. The present implementation utilizes RWR type wire-wound resistors. The primary advantages of this type of resistor includes small size, high power handling capability, excellent temperature stability, and high reliability.

The purpose of diode CR5 is to provide electrical isolation. Diode CR4 protects the base-emitter junction of transistor Q2 from accidental damage, such as might occur during test conditions. In the absence of diode CR4 an excessive negative voltage inadvertently applied to the sensing terminal could result in damage to the base-emitter junction of transistor Q1. Under this fault condition Zener diode CR4 clamps the base-to-base differential voltage at a safe value.

The output signal from the differential switch is a current which flows in the collector circuit of either transistor Q2 or transistor Q3. This current is the switched output of the transistor Q1 current source. The collector currents drive the opto-isolator integrated circuits 30a and 30b. As previously described, the current source is designed to provide an output current level equal to the optimum value specified for driving the opto-isolator light emitting diodes. When transistor Q3 conducts, isolator 30b is "on" and its output on line 14 goes to a logic "low" state. Conversely, if transistor Q2 conducts, the output of isolator 30a on line 16 goes to a logic "low" state. Both output circuits are of the open-collector type and require resistors R9 and R10 for pull-up to a logic "high" state. The existence of simultaneous logic "lows" or "highs" at both opto-isolator outputs indicates a condition of abnormal operation.

This abnormal output signal condition is detected by the avionics system built-in-test circuitry and a fault condition is indicated. This feature is important since the single most probable failure is gradual degradation of LED output power level resulting in an ultimate loss of output signal. The redundant nature of the circuit configuration makes this condition readily apparent.

The solid state monitor circuit 10 is capable of operating at both d-c and into the lower audio frequency range. The upper frequency of operation is limited by the use of wire-wound resistors. The use of metal-film resistors would extend the upper operating frequency range; however, resistor physical size would be increased drastically.

Obviously, other embodiments and modifications of the subject invention will readily come to the mind of one skilled in the art having the benefit of the teachings presented in the foregoing description and the drawing. It is, therefore, to be understood that this invention is not to be limited thereto and that said modifications and embodiments are intended to be included within the scope of the appended claims.

What is claimed is:

1. A resistance monitoring circuit for providing first or second logic level signals as a first output indicative of the presence or absence of at least a predetermined high ohmic condition of the monitored resistance and for providing third or fourth logic level signals as a second output indicative of presence or absence of a predetermined low ohmic condition of the monitored resistance, said circuit comprising:
   a voltage source;
   first voltage divider means connected to said voltage source for providing a first control voltage;
   second voltage divider means connected to said voltage source and including said monitored resistance for providing a second control voltage that changes relative to said first control voltage with changes in said monitored resistance;
   current regulating means, connected to said voltage source, for providing a source of regulated current;
   means defining first and second current paths comprising first and second current to voltage logic level conversion means, respectively; and
   first and second solid state switching means, responsive to said first and second control voltages, for directing substantially all said regulated current from said current source through said first current path only when said first control voltage exceeds said second control voltage by a predetermined amount that is small relative to said control voltages and through said second current path only when said second control voltage exceeds said first control voltage by a like predetermined amount, whereby said first conversion means provides as said first output said first logic level signal only when said predetermined high ohmic condition exists and said second logic level signal only when said predetermined high ohmic condition does not exist, and provides as said second output said third logic level signal only when said predetermined low ohmic condition exists and said fourth logic level signal only when said low ohmic condition does not exist.

2. A resistance monitoring circuit as defined in claim 1, and wherein:
   said first and second current to voltage logic level means each comprise an opto-isolator means for electrically isolating said logic outputs from the rest of the monitoring circuit.

3. A resistance monitoring circuit as defined in claim 2, and wherein:
   said first and second solid state switching means comprise first and second PNP transistors having their emitters connected to said current source, their collectors connected to said first and second opto-isolator means, respectively, and their bases connected to said first and second voltage divider means, respectively.

4. A resistance monitoring circuit as defined in claim 3, and wherein:
   said current source comprises a third transistor and a zener diode referenced biasing network for controlling bias thereof.

5. A resistance monitoring circuit as defined in claim 4, and wherein:
   said first and second voltage divider means comprise bias resistor networks and are connected in common to said voltage source through a zener diode.

6. A resistance monitoring circuit as defined in claim 5, and wherein:
   said first and second opto-isolator means comprise first and second light emitting diodes in said first and second current paths, and first and second light responsive means having their respective outputs connected to a logic voltage source through first and second pull-up resistors.

* * * * *